United States Patent
Taniguchi

(10) Patent No.: US 8,212,633 B2
(45) Date of Patent: Jul. 3, 2012

(54) LAMINATED BAND PASS FILTER

(75) Inventor: Tetsuo Taniguchi, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/729,277

(22) Filed: Mar. 23, 2010

(65) Prior Publication Data

US 2010/0171568 A1 Jul. 8, 2010

Related U.S. Application Data

(63) Continuation of application No. PCT/JP2008/066522, filed on Sep. 12, 2008.

(30) Foreign Application Priority Data

Sep. 27, 2007 (JP) ................................ 2007-251660

(51) Int. Cl.
*H03H 7/09* (2006.01)
(52) U.S. Cl. .................... 333/175; 333/185; 333/177
(58) Field of Classification Search .......... 333/165–168, 333/175, 176, 185, 202, 204, 205
See application file for complete search history.

(56) References Cited

U.S. PATENT DOCUMENTS

| | | | |
|---|---|---|---|
| 4,418,324 A | 11/1983 | Higgins | |
| 5,777,533 A | 7/1998 | Kato et al. | |
| 6,222,427 B1 | 4/2001 | Kato et al. | |
| 7,068,124 B2 | 6/2006 | White et al. | |
| 2002/0030561 A1 | 3/2002 | Masuda et al. | |
| 2002/0093397 A1* | 7/2002 | Nosaka | 333/185 |
| 2003/0048156 A1* | 3/2003 | Uriu et al. | 333/175 |
| 2004/0085164 A1 | 5/2004 | Hirabayashi | |
| 2008/0180192 A1 | 7/2008 | Sakisaka et al. | |

FOREIGN PATENT DOCUMENTS

| | | |
|---|---|---|
| EP | 1 265 311 A2 | 12/2002 |
| EP | 1 304 761 A1 | 4/2003 |
| EP | 2 009 787 A1 | 12/2008 |
| JP | 3-274814 A | 12/1991 |
| JP | 4-6911 A | 1/1992 |
| JP | 9-35936 A | 2/1997 |
| JP | 9-307389 A | 11/1997 |
| JP | 10-190308 A | 7/1998 |

(Continued)

OTHER PUBLICATIONS

Official Communication issued in International Patent Application No. PCT/JP2008/066522, mailed on Oct. 21, 2008.
Official Communication issued in corresponding Japanese Patent Application No. 2009-534277, mailed on Feb. 15, 2011.
Official Communication issued in corresponding European Patent Application No. 08833486.7, mailed on Jun. 8, 2011.

(Continued)

*Primary Examiner* — Benny Lee
*Assistant Examiner* — Gerald Stevens
(74) *Attorney, Agent, or Firm* — Keating & Bennett, LLP

(57) ABSTRACT

A small low-loss laminated band pass filter attains steep attenuation from a pass band to out-of pass band and reduced ripple in the band. Capacitances are generated between a ground electrode on a ground electrode forming layer and capacitor electrodes on a capacitor electrode forming layer, a plurality of inductor electrodes are defined by via electrodes and the line electrodes, and portions of respective loop surfaces of the inductor electrodes overlap with one another when viewed from a direction of arrangement of the inductor electrodes. Furthermore, a line electrode is arranged on a first line electrode forming layer and line electrodes are arranged on a second line electrode forming layer.

8 Claims, 3 Drawing Sheets

FOREIGN PATENT DOCUMENTS

| | | |
|---|---|---|
| JP | 11-97963 A | 4/1999 |
| JP | 2000-201001 A | 7/2000 |
| JP | 2003-45723 A | 2/2003 |
| JP | 2003-198226 A | 7/2003 |
| JP | 2005-12258 A | 1/2005 |
| JP | 2008-187418 A | 8/2008 |
| WO | 02/09225 A1 | 1/2002 |
| WO | 2007/119356 A1 | 10/2007 |

OTHER PUBLICATIONS

Chang et al., "Bandpass Filter of Serial Configuration With Two Finite Transmission Zeros Using LTCC Technology", IEEE Transactions on Microwave Theory and Techniques, vol. 53, No. 7, Jul. 2005, pp. 2383-2388.

Official Communication issued in corresponding Taiwanese Patent Application No. 097131398, mailed on Dec. 16, 2011.

* cited by examiner

LAMINATED BAND PASS FILTER

BACKGROUND OF THE INVENTION

1. Field of the Invention

The present invention relates to a laminated band pass filter including a plurality of dielectric layers and a plurality of electrode layers laminated on one another.

2. Description of the Related Art

In general, a laminated band pass filter is used as a high-frequency band pass filter. The laminated band pass filter is configured such that a plurality of LC resonators are included in a laminated body constituted by laminating dielectric layers and electrode layers. The laminated band pass filter thus configured is suitable for miniaturization and cost reduction.

Conventional laminated band pass filters are disclosed in Japanese Unexamined Patent Application Publication No. 4-6911, Japanese Unexamined Patent Application Publication No. 2000-201001, Japanese Unexamined Patent Application Publication No. 2003-198226, and International Publication No. 02/009225.

FIG. 1 is a circuit diagram illustrating a laminated band pass filter disclosed in Japanese Unexamined Patent Application Publication No. 4-6911.

This filter includes a plurality of LC parallel resonant circuits which have coils and capacitors, each of the coils and a corresponding one of the capacitors being connected to each other. The LC parallel resonant circuits are magnetically connected to the adjacent LC parallel resonant circuits by the coils of resonators adjacent to one another.

FIG. 2 is a sectional view illustrating the laminated band pass filter.

A ground electrode 11 is arranged in a first layer 10-1. Capacitor electrodes 12 and coil patterns 13 are arranged in second and third layers 10-2 and 10-3. Capacitance is interposed between the ground electrode 11 and the capacitor electrode 12. The coil patterns 13 arranged in two layers are electrically connected to one another through blind through holes 14. A LC parallel resonant circuit is configured by the ground electrode 11, the capacitor electrodes 12, the coil patterns 13, and the blind through holes 14. An LC parallel resonant circuit is further laminated in layers under a fourth layer 10-4. As a result, a plurality of LC parallel resonant circuits are magnetically connected to one another through the coils.

A laminated band pass filter disclosed according to Japanese Unexamined Patent Application Publication No. 2000-201001 includes a plurality of LC resonators having self-resonant capacitors. The LC resonators are laminated in a thickness direction of a laminated body, and are electromagnetically connected to one another. As a result, components can be miniaturized while physical distances among the LC resonators required due to design of the band pass filter are ensured.

A laminated band pass filter disclosed in Japanese Unexamined Patent Application Publication No. 2003-198226 includes filter lines, each of the filter lines having a pair of lines, which are parallel to each other and which are arranged on portions of wiring layers. The first and second filter lines are arranged on different circuit layers and face each other in parallel. The lines which face each other in a thickness direction are electrically connected to each other at a terminal portion and bent through a dielectric layer.

The laminated band pass filter disclosed in International Publication No. 02/009225 has two strip lines constituting a resonator which are arranged in the same layer with a predetermined interval.

According to the laminated band pass filter of Japanese Unexamined Patent Application Publication No. 4-6911, the coils included in the LC parallel resonators are formed in a two-layer coil pattern. Therefore, magnetic connection among the LC parallel resonators is likely to become considerably strong. Furthermore, since the coils are formed in the two-layer coil pattern, there arises a problem in that insertion loss of the laminated band pass filter becomes large due to deterioration of Q values of the coils. To address these problems, sufficient intervals are required among the LC parallel resonators. However, in this case, the thickness and the size of the laminated band pass filter become large.

According to the laminated band pass filter of Japanese Unexamined Patent Application Publication No. 2000-201001, the capacitors spontaneously resonate. Therefore, each of the LC resonators is configured by a capacitance component of a capacitor electrode and an inductance component included in the capacitor electrode. In this case, it is difficult to configure a resonator having a desired inductance, and there arises a problem in that a low-loss characteristic of the band pass filter is not obtained.

According to the laminated band pass filters of Japanese Unexamined Patent Application Publication No. 4-6911 and International Publication No. 02/009225, small and low-loss band pass filters can be attained. However, in order to attain a characteristic of steep attenuation from a pass band to out-of-band, resonators should be arranged in multiple stages and the filters arranged in the two stages should be laminated in a lamination direction and connected to one another. Therefore, there arises a problem in that, when a filter having multiple stages is configured, the thickness thereof becomes large.

Furthermore, in the conventional laminated band pass filters, in a case where LC parallel resonators having capacitor electrodes and inductor electrodes are arranged in a laminated body, and the inductor electrodes adjacent to one another are inductively coupled with one another, a ripple (deviation) may occur in a band pass characteristic of a pass band.

SUMMARY OF THE INVENTION

Accordingly, preferred embodiments of the present invention solve the above problems and provide a laminated band pass filter which attains steep attenuation from a pass band to an out-of pass band and reduced ripple in the band.

A laminated band pass filter according to a preferred embodiment of the present invention includes a laminated body including a plurality of dielectric layers and a plurality of electrode layers laminated with each other. The laminated band pass filter further includes LC parallel resonators. The LC parallel resonators are configured by connecting a ground electrode and capacitor electrodes which are arranged on any of the electrode layers to inductor electrodes. Each of the inductor electrodes extends from a connection point between one of the LC parallel resonator and a corresponding one of the capacitor electrodes through a corresponding one of the electrode layers which is different from the electrode layer including the capacitor electrodes to a connection point between the LC parallel resonator and the ground electrode, and is formed in a loop shape when viewed from a perpendicular direction relative to a lamination direction of the laminated body. The inductor electrodes of at least two of the LC parallel resonators pass different electrode layers.

The two LC parallel resonators including the inductor electrodes passing the different electrode layers are arranged in an arrangement direction perpendicular or substantially perpendicular to the lamination direction of the dielectric layers and the electrode layers. Furthermore, the inductor electrodes of the two LC parallel resonators are arranged such that the loops overlap with each other when viewed from the arrangement direction.

Directions of the loops of the inductor electrodes of the two LC parallel resonators are opposite to each other.

At least one of the two LC parallel resonators is a resonator of an input stage or an output stage.

Each of the inductor electrodes of the LC parallel resonators includes via electrodes and a line electrode. The via electrodes extend in the lamination direction of the dielectric layers and the electrode layers. The line electrode passes a corresponding one of the electrode layers.

The line electrodes of the two LC parallel resonators are arranged so as to overlap with each other in a loop shape when viewed from the lamination direction.

At least one of the line electrodes of the two LC parallel resonators has a meander-line shape or a U-shape.

At least one of an input electrode connected to the LC parallel resonator of the input stage and an output electrode connected to the LC parallel resonator of the output stage is connected to one of the via electrodes between a corresponding one of the line electrodes and a corresponding one of the capacitor electrodes.

A capacitor electrode for skip coupling is provided. The capacitor electrode has one terminal which faces one of the capacitor electrodes of the two LC parallel resonators and the other terminal which faces the other of the capacitor electrodes of the two LC parallel resonators.

The capacitor electrode of the LC parallel resonator of the input stage and the capacitor electrode of the LC parallel resonator of the output stage are adjacent to each other in the same electrode layer.

Since the inductor electrodes included in the two LC parallel resonators pass the different electrode layers, even when the laminated band pass filter is small and the height of the filter is small, large dedicated regions for the inductor electrodes are attained in the electrode layers. Accordingly, a degree of freedom of design including shapes, widths, and lengths of the inductor electrodes is enhanced. Specifically, by widening the electrode widths, Q values of the inductors are enhanced. As a result, resonators having desired inductance can be configured, and a laminated band pass filter which attains low-loss in a desired pass band can be realized.

Since the loop surfaces of the two LC parallel resonators face the arrangement direction and the loops overlap with each other when the laminated body is viewed from the arrangement direction, the LC parallel resonators are coupled with each other. In this case, inductive coupling between the resonators is arbitrarily controlled.

Since the directions of the loop surfaces of the two LC parallel resonators are opposite to each other, ripple of a band pass characteristic in the pass band is suppressed, and excellent band pass characteristic is obtained.

Since the two LC parallel resonators correspond to a resonator of an input/output stage and a resonator adjacent thereto, a degree of freedom of setting of the inductances of the LC parallel resonators is enhanced. If the inductor electrodes of the LC parallel resonators are arranged on the same electrode layer, the inductor electrodes may be only formed in a limited region on the electrode layer. However, since the resonators are arranged on different electrode layers, the inductor electrodes can be arranged in a large region in the electrode layers in which the resonators pass. Accordingly, a degree of freedom of setting of the LC parallel resonators is enhanced.

Since the inductor electrodes are configured by the line electrodes and the via electrodes, a thickness of the laminated band pass filter in the lamination direction is suppressed. Furthermore, since relative position accuracy of the via electrode is high, even if a shift due to cutting of the laminated body or a shift of the lamination is generated, changes of capacitance characteristics and inductance characteristics, and shifts of resonant frequencies can be reduced.

Since the line electrodes of the two LC parallel resonators overlap with each other in a loop shape when the laminated body is viewed from the lamination direction, a degree of coupling (inductive coupling) between the LC parallel resonators can be enhanced. Accordingly, a laminated band pass filter attaining a low insertion loss and having a characteristic of a wider pass band can be realized.

Since the line electrodes are preferably arranged to have meander shapes or U-shapes, comparatively long line electrodes are realized in a limited area. Therefore, the area can be reduced in order to obtain required inductances, and a small laminated band pass filter is attained. Furthermore, overlapping of the line electrodes in the lamination direction of the laminated body is facilitated.

Since the input/output electrodes are connected to the via electrodes between the line electrodes and the capacitor electrodes, electrodes used for connection of the input/output electrodes are not required, and therefore, characteristics of high Q values of the resonators can be utilized by suppressing conduction losses.

Since the capacitor electrode for the skip coupling is provided, the skip coupling is easily controlled.

Since the capacitor electrode of the LC parallel resonator of the input stage and the capacitor electrode of the LC parallel resonator of the output stage are arranged adjacent to each other, a capacitive coupling between the capacitor electrode of the LC parallel resonator on the input side and the capacitor electrode of the LC parallel resonator on the output side can be set without being affected by the other capacitor electrodes. This capacitive coupling between the LC parallel resonator of the input stage and the LC parallel resonator of the output stage is referred to herein as "skip coupling". It should be noted that the phrase "skip coupling" as used herein is broad enough to include coupling between any [N]th LC resonator and an [N+2]th LC resonator, wherein N is an integer.

Other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A laminated band pass filter according to preferred embodiments will be described hereinafter. The filter described hereinafter is a band pass filter in which LC parallel resonators in three layers are connected to one another.

Figure 1:
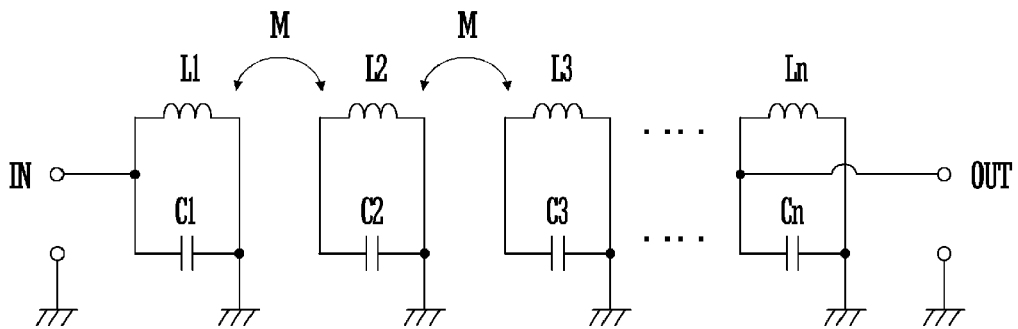
FIG. 1 is a circuit diagram illustrating a laminated band pass filter disclosed in Japanese Unexamined Patent Application Publication No. 4-6911.
Figure 2:
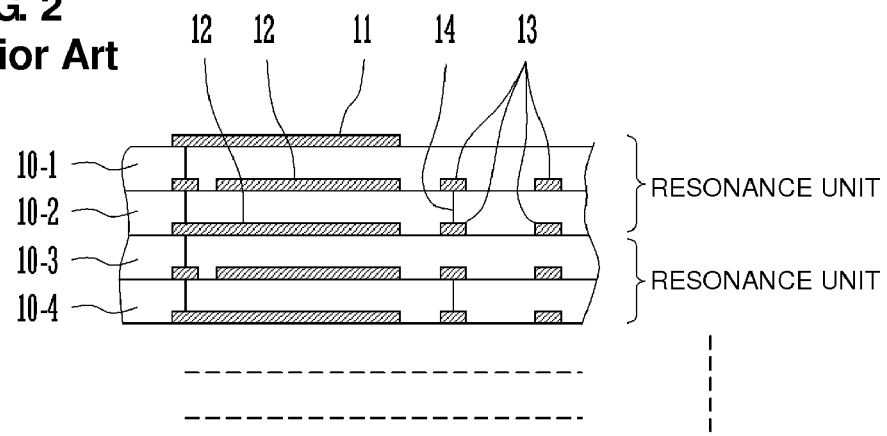
FIG. 2 is a sectional view illustrating the laminated band pass filter disclosed in Japanese Unexamined Patent Application Publication No. 4-6911.
Figure 3:
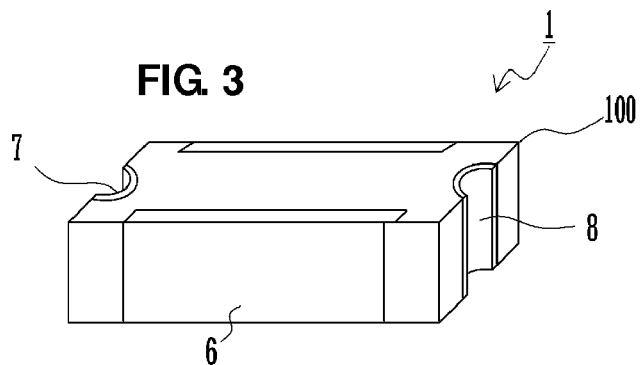
FIG. 3 is a perspective view of appearance of a laminated band pass filter according to a first preferred embodiment of the present invention.

FIG. 3 is a perspective view of appearance of the band pass filter.

A laminated band pass filter 1 includes a laminated body 100. The laminated body 100 is configured such that dielectric layers and electrode layers are laminated on one another in a vertical direction serving as a lamination direction. Among four sides which are parallel to the lamination direction of the laminated body 100, on two sides having short sides, input/output terminals 7 and 8 are arranged, and on the remaining other two sides, ground terminals 6 are arranged. The presence of the ground terminals 6 between the input/output terminals 7 and 8 prevents input/output signals from being unnecessary coupled.

Figure 4:
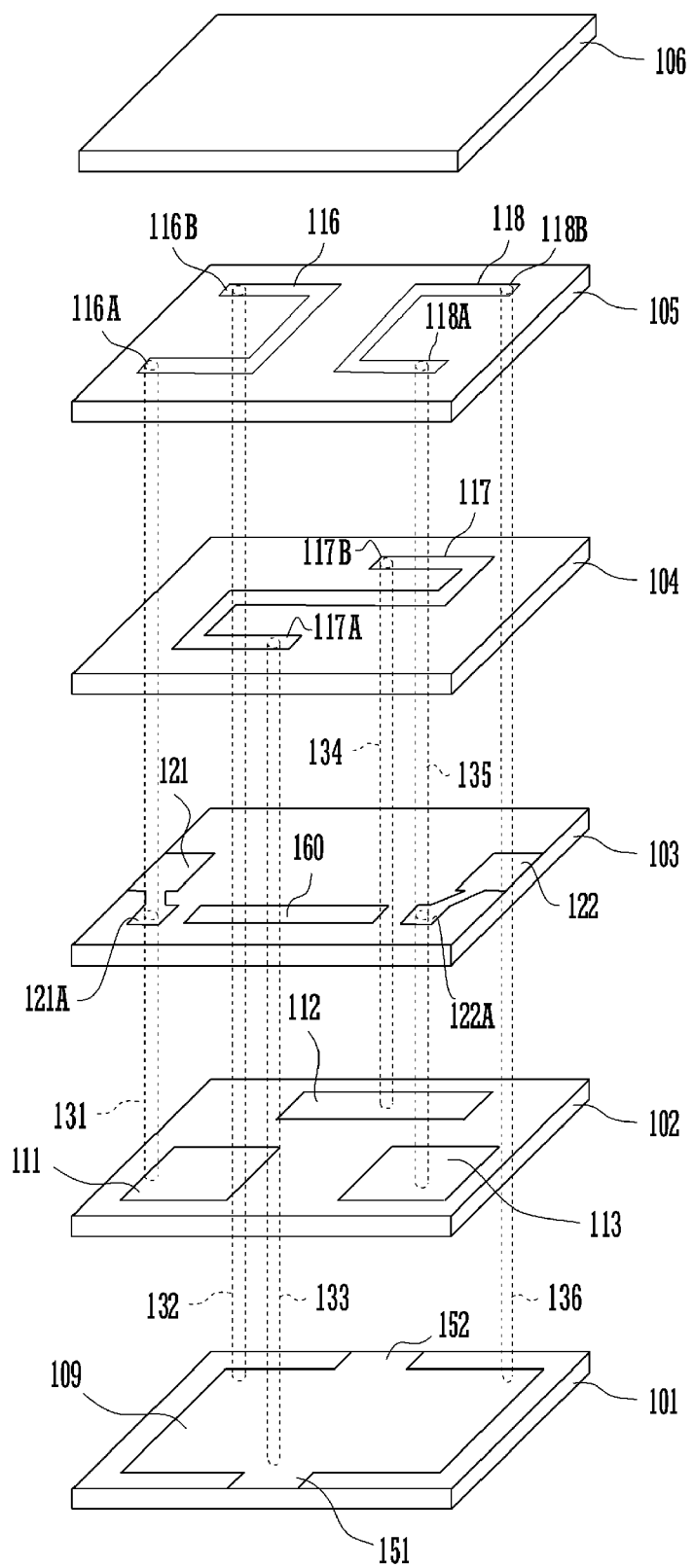
FIG. 4 is an exploded perspective view illustrating the laminated band pass filter.

FIG. 4 is an exploded perspective view illustrating the filter.

The laminated body 100 includes a ground electrode forming layer 101, a capacitor electrode forming layer 102, an input/output electrode forming layer 103, a first line electrode forming layer 104, a second line electrode forming layer 105, and an external layer 106. The layers 101 to 106 are dielectric layers. Furthermore, on the layers 101 to 105, electrodes constituting electrode layers are provided. Accordingly, the filter includes the six dielectric layers and the five electrode layers, and the input/output terminals and the ground terminal are arranged on end surfaces of the laminated body.

Each of the layers 101 to 105 preferably has a rectangular shape having long sides of 1.6 mm, short sides of 0.8 mm, and a thickness of 0.4 mm, for example. Furthermore, each of the layers 101 to 106 is constituted by a low-temperature Co-fired ceramic (LTCC) having a relative permittivity of $\in r \le 3.5$, for example. The LTCC is constituted by at least one component such as titanium oxide, barium oxide, or alumina, for example, and a glass component. Note that relative permittivities of the line electrode forming layers 104 and 105 and the external layer 106 are preferably in a range from 6 inclusive to 80 inclusive. Furthermore, a relative permittivity of the capacitor electrode forming layer 102 is preferably in a range from 20 inclusive to 80 inclusive.

The ground electrode forming layer 101 includes a ground electrode 109 and ground connection electrodes 151 and 152 provided on an upper surface thereof. The ground electrode 109 preferably has a rectangular shape in a region inside a plan outline of the layer 101 with a predetermined gap therebetween. The ground connection electrodes 151 and 152 preferably have line shapes and extend from the ground electrode 109 to respective side surfaces having the long sides of the ground electrode forming layer 101, and electrically connected to a ground terminal (not shown) at an end surface of the laminated body.

The capacitor electrode forming layer 102 includes capacitor electrodes 111 to 113 provided on an upper surface thereof. The capacitor electrodes 111 and 113 are arranged in the vicinity of two corners defined by one of the long sides on a front side in the drawing, respectively. The capacitor electrode 112 is arranged in a position in the vicinity of the center of one of the long sides on a far side in the drawing so as not to be sandwiched between the capacitor electrodes 111 and 113. Note that sizes of the capacitor electrodes are set such that capacitance required for the LC parallel resonators is obtained.

The input/output electrode forming layer 103 includes input/output electrodes 121 and 122 and an input-to-output capacitor electrode 160 provided on an upper surface thereof. The input/output electrodes 121 and 122 preferably have rectangular shapes and each is arranged in contact with side surfaces having the short sides of the layer 103 and in the vicinity of the center of the short sides, and are electrically connected to an input/output terminal (not shown) at the end surface of the laminated body. Furthermore, projecting electrode sections 121A and 122A extend in a front direction in the drawing from the input/output electrodes 121 and 122, respectively. The projecting electrode sections 121A and 122A face each other with a predetermined gap therebetween. The input-to-output capacitor electrode 160 is arranged in a region between the projecting electrode sections 121A and 122A with predetermined gaps between the input-to-output capacitor electrode 160 and the respective projecting electrode sections 121A and 122A. Both ends of the input-to-output capacitor electrode 160 face the capacitor electrodes 111 and 113 through the input/output electrode forming layer 103.

The first line electrode forming layer 104 includes a line electrode 117 provided on an upper surface thereof. The line electrode 117 preferably has a meander-line shape.

The second line electrode forming layer 105 includes line electrodes 116 and 118 provided on an upper surface thereof. Each of the line electrodes 116 and 118 is preferably U-shaped.

The layers 102 to 105 include via electrodes 131 to 136 extending in the lamination direction.

The via electrode 131 is electrically connected to one end 116A of the line electrode 116 and the capacitor electrode 111. The via electrode 132 is electrically connected to the other end 116A of the line electrode 116 and the ground electrode 109. The via electrode 131, the line electrode 116, and the via electrode 132 constitutes a first inductor electrode. The via electrode 131 is also electrically connected to a projecting electrode section 121A of the input/output electrode 121.

The via electrode 135 is electrically connected to one end 118A of the line electrode 118 and the capacitor electrode 113. The via electrode 136 is electrically connected to the other end 118B of the line electrode 118 and the ground electrode 109. The via electrode 135, the line electrode 118, and the via electrode 136 constitute a third inductor electrode. The via electrode 135 is also electrically connected to the projecting electrode section 122A of the input/output electrode 122.

The via electrode 133 is electrically connected to one end 117A of the line electrode 117 and the ground electrode 109. The via electrode 134 is electrically connected to the other end 117B of the line electrode 117 and the capacitor electrode 112. The capacitor electrode 113, the line electrode 117, and the via electrode 134 constitute a second inductor electrode. Note that the via electrode 133 is located near the via electrode 131. Furthermore, the via electrode 134 is located near the via electrode 136.

The laminated band pass filter 1 is configured as described above.

The first to third inductor electrodes are connected to the capacitor electrodes 111 to 113, respectively, at first ends thereof, and connected to the ground electrode 109 at second ends thereof. The capacitor electrodes 111 to 113 face the ground electrode 109. Accordingly, a set of the first inductor electrode and the capacitor electrode 111, a set of the second inductor electrode and the capacitor electrode 112, and a set of the third inductor electrode and the capacitor electrode 113 each constitute the LC parallel resonators.

The via electrode 131 included in the first inductor electrode is electrically connected to the projecting electrode section 121A of the input/output electrode 121. Therefore, the resonator including the first inductor electrode and the capacitor electrode 111 is the LC parallel resonator of an input/output stage (input stage).

The via electrode 135 included in the third inductor electrode is electrically connected to the projecting electrode section 122A of the input/output electrode 122. Therefore, the resonator including the third inductor electrode and the capacitor electrode 113 is the LC parallel resonator of an input/output stage (output stage).

The line electrode 117 is arranged on the first line electrode forming layer 104, and the line electrodes 116 and 118 are arranged on the second line electrode forming layer 105. Therefore, an area of dedicated regions for arranging the line electrodes 116 to 118 is larger than the same area in a case where the line electrodes 116 to 118 are arranged in one layer.

The line electrode 117 preferably has the meander-line shape, and each of the line electrodes 116 and 118 are preferably U-shaped. Therefore, the comparatively long line electrodes can be formed in the limited dedicated areas. Accordingly, line lengths of the line electrodes 116 to 118 are ensured, and inductances of desired values are attained. Furthermore, line widths of the line electrodes 116 to 118 can be ensured, and accordingly, high Q values can be attained. Consequently, sizes of the dedicated areas for the line electrodes 116 to 118 can be reduced, and the entire filter can be miniaturized.

The input/output electrodes 121 and 122 are connected to the LC parallel resonators of the input stage and the output stage, respectively, by connecting the projecting electrode sections 121A and 122A to the via electrodes 131 and 135, respectively, with each other. The via electrodes 131 and 135 constitute inductor electrodes of the respective LC parallel resonators. Therefore, electrodes used for connection of the input/output electrodes 121 and 122 are not required, and therefore, characteristics of high Q values of the resonators can be utilized by suppressing conduction losses. Furthermore, by changing the thickness of the input/output electrode forming layer, positions in which the input/output electrodes project from the inductor electrodes can be arbitrarily changed. Accordingly, desired input/output impedance is obtained.

When the first to third inductor electrodes are transparently viewed from an arrangement direction of the inductor electrodes, the first to third inductor electrodes are arranged such that loop surfaces thereof overlap with one another at least one portion. Therefore, the LC parallel resonators adjacent to each other are inductively coupled with each other.

Furthermore, when the first and second inductor electrodes are viewed from the lamination direction of the laminated body, the first and the second inductor electrodes are arranged such that a U-shaped portion of the line electrode 117 which is in the in the vicinity of the end 117A and the U-shaped line electrode 116 overlap with each other so as to surround a rectangular region. Furthermore, the second and third inductor electrodes are arranged such that a U-shaped portion of the line electrode 117 which is in the vicinity of the end 117B and the U-shaped line electrode 118 overlap with each other so as to surround a rectangular region. Accordingly, inductive coupling between the adjacent LC parallel resonators is enhanced.

The capacitor electrodes 111 and 112 are arranged on the capacitor electrode forming layer 102 with a predetermined gap therebetween. Furthermore, the capacitor electrodes 112 and 113 are also arranged on the capacitor electrode forming layer 102 with a predetermined gap therebetween. Therefore, the adjacent LC parallel resonators are capacitively coupled with each other.

Moreover, the capacitor electrodes 111 and 113 are arranged on the capacitor electrode forming layer 102 with a predetermined gap therebetween. The capacitor electrodes 111 and 113 face the input-to-output capacitor electrode 160. Therefore, the LC parallel resonator of the input stage and the LC parallel resonator of the output stage are capacitively coupled with each other, which as described above is referred to as "skip coupling" and can include coupling between any [N]th LC resonator and an [N+2]th LC resonator, wherein N is an integer.

Moreover, the input-to-output capacitor electrode 160 is located in the vicinity of the projecting electrode sections 121A and 122A, and the projecting electrode sections 121A and 122A are connected to the LC parallel resonator of the input stage and the LC parallel resonator of the output stage, respectively. Accordingly, capacitance generated between the input-to-output capacitor electrode 160 and the projecting electrode sections 121A and 122A enhances the skip coupling between the LC parallel resonator of the input stage and the LC parallel resonator of the output stage.

The capacitor electrodes are arranged as described above. Accordingly, capacitance generated between the capacitor electrodes 111 and 112 and capacitance generated between the capacitor electrodes 112 and 113 are relatively smaller than capacitance for the skip coupling generated between the capacitor electrodes 111 and 113. Furthermore, the capacitance for the skip coupling generated between the capacitor electrodes 111 and 113 can be set as an optimum value independently from the capacitance generated between the capacitor electrodes 111 and 112 and the capacitance generated between the capacitor electrodes 112 and 113.

Accordingly, by appropriately designing a presence or absence, a shape, and a formation position of the input-to-output capacitor electrode, or by appropriately designing the gaps among the capacitor electrodes, capacitance between input and output terminals can be arbitrarily set. Accordingly, setting of a frequency of an attenuation pole using a bandpass characteristic is facilitated.

Furthermore, the conductive coupling of the first to third inductor electrodes is affected by loop directions of the inductor electrodes.

The inductor electrodes constituted by the via electrodes 131 to 136 and the line electrodes 116 to 118 and the loop directions of the inductor electrodes have the following relationships.

TABLE 1

| INDUCTOR ELECTRODE | VIA ELECTRODE | LINE ELECTRODE | LOOP DIRECTION |
| --- | --- | --- | --- |
| FIRST | 131, 132 | 116 | 1 |
| SECOND | 133, 134 | 117 | 0 |
| THIRD | 135, 136 | 118 | 1 |

Note that the "loops" formed by the inductor electrodes correspond to paths of the inductor electrodes extending from connection points between the capacitor electrodes and the inductor electrodes to connection points between the ground electrode and the inductor electrodes. That is, each of the loops is formed of a connection path extending from a connection point between a corresponding one of the capacitor electrodes and a corresponding one of the via electrodes serving as a starting point through the via electrode, a corresponding one of the line electrodes, and a corresponding one of the other via electrodes.

The "loop directions" are circulating directions from the starting points of the loops when the loops are viewed from one direction of a direction of arrangement of the line electrodes. For example, when the loops formed by the inductor electrodes are viewed from the input/output electrode 121 side to the input/output electrode 122 side, the first inductor electrode forms the loop by a connection path extending from a connection point (starting point) between the capacitor electrode 111 and the via electrode 131 through the via electrode 131 and the line electrode 116, to the via electrode 132, and the loop direction of the first inductor electrode is in a counterclockwise direction. The second inductor electrode forms the loop by a connection path extending from a connection point (starting point) between the capacitor electrode 112 and the via electrode 134 through the via electrode 134 and the line electrode 117 to the via electrode 133, and the loop direction of the second inductor electrode is in a clockwise direction. The third inductor electrode forms the loop by a connection path extending from a connection point (starting point) between the capacitor electrode 113 and the via electrode 135 through the via electrode 135 and the line electrode 118 to the via electrode 136, and the loop direction of the third inductor electrode is in a counterclockwise direction. Here, since the loop directions are only selected from the left and right directions, one of the directions is denoted by "1" and the other is denoted by "0".

Polarities of the connections between the three (three-stage) LC parallel resonators can be denoted by "101" in an order from an input side to an output side of the band pass filter.

As described above, the loop direction of the inductor electrode (first inductor electrode) of the LC parallel resonator on the input side is opposite to the loop direction of the inductor electrode (second inductor electrode) of the adjacent LC parallel resonator. Furthermore, the loop direction of the inductor electrode (third inductor electrode) of the LC parallel resonator on the output side is opposite to the loop direction of the inductor electrode (second inductor electrode) of the adjacent LC parallel resonator. As described above, since the loop directions of the inductor electrodes of the LC parallel resonators adjacent to each other are opposite to each other, and particularly, since the loop directions of the inductor electrodes of the LC parallel resonators on the input side and the output side are opposite to the loop direction of the inductor electrode of the LC parallel resonator connected to the LC parallel resonator on the input side and the LC parallel resonator on the output side, ripple in the pass band can be reduced.

Moreover, although the line electrodes, the capacitor electrodes, and the via electrodes are connected using the via electrodes, since a position accuracy of the via electrodes is high, even if a shift due to cutting of the laminated body or a shift of lamination is generated, changes of capacitance characteristics and inductance characteristics, and shifts of resonant frequencies can be reduced.

Next, a circuit of the laminated band pass filter 1 will be described.

Figure 5:
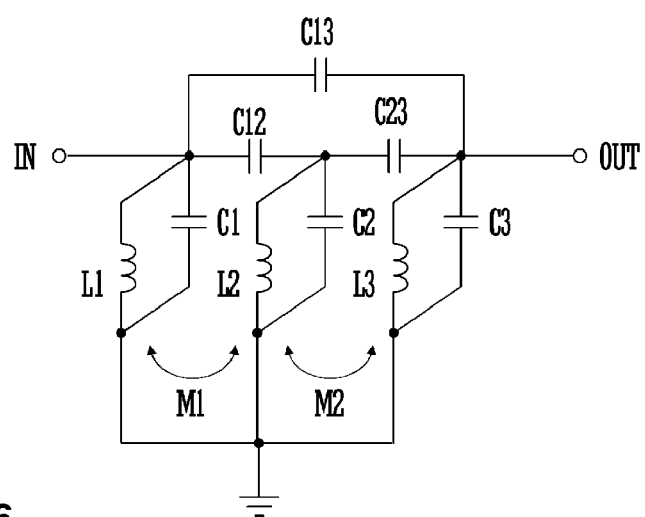
FIG. 5 is a diagram illustrating an equivalent circuit of the laminated band pass filter.

FIG. 5 is a circuit diagram of the filter.

An input terminal IN corresponds to the input/output terminal 7 which is electrically connected to the input/output electrode 121, and an output terminal OUT corresponds to the input/output terminal 8 which is electrically connected to the input/output electrode 122.

An inductor L1 denotes inductance generated by the inductor electrode constituted by the line electrode 116 and the via electrodes 131 and 132. An inductor L2 denotes inductance generated by the inductor electrode constituted by the line electrodes 117 and the via electrodes 133 and 134. An inductor L3 denotes inductance generated by the inductor electrode constituted by the line electrode 118 and the via electrodes 135 and 136. A combination of the loop directions of the inductor electrodes is "101".

Capacitors C1, C2, and C3 denote capacitance generated between the capacitor electrodes 111 to 113 and the ground electrode 109. A capacitor C12 denotes capacitance generated in the electrode gap between the capacitor electrodes 111 and 112. A capacitor C23 denotes capacitance generated in the electrode gap between the capacitor electrodes 112 and 113. A capacitor C13 denotes capacitance obtained by combining capacitance generated in the electrode gap between the capacitor electrodes 112 and 113, capacitance generated in the electrode gaps between the input-to-output capacitor electrode 160 and the projecting electrode sections 121A and 122A, and capacitance generated between both ends of the input-to-output capacitor electrode 160 and the capacitor electrodes 111 and 113.

Depending on the overlap states among the loops of the line electrodes 116 to 118, an inductive coupling M1 is generated between the inductors L1 and L2, and an inductive coupling M2 is generated between the inductors L2 and L3. Furthermore, since the via electrode 133 is located near the via electrode 131, and the via electrode 134 is located near the via electrode 136, the inductive couplings M1 and M2 between the via electrodes located near each other are enhanced.

With the configuration described above, the resonator in the three stages are inductively coupled with one another in the loop direction "101", and capacitively coupled by the capacitors C12, C23, and C13. Accordingly, the laminated band pass filter functions as a band pass filter including the LC parallel resonators in three stages.

Note that each of the first and second line electrodes 104 and 105 is patterned preferably so as to be point symmetrical about the center. Therefore, the inductors L1 and L3 of the LC parallel resonators in the first and third stages preferably are equal to each other in the equivalent circuit, and the inductive coupling M1 between the inductors L1 and L2 and the inductive coupling M2 between the inductors L2 and L3 are equal to each other.

Figure 6:
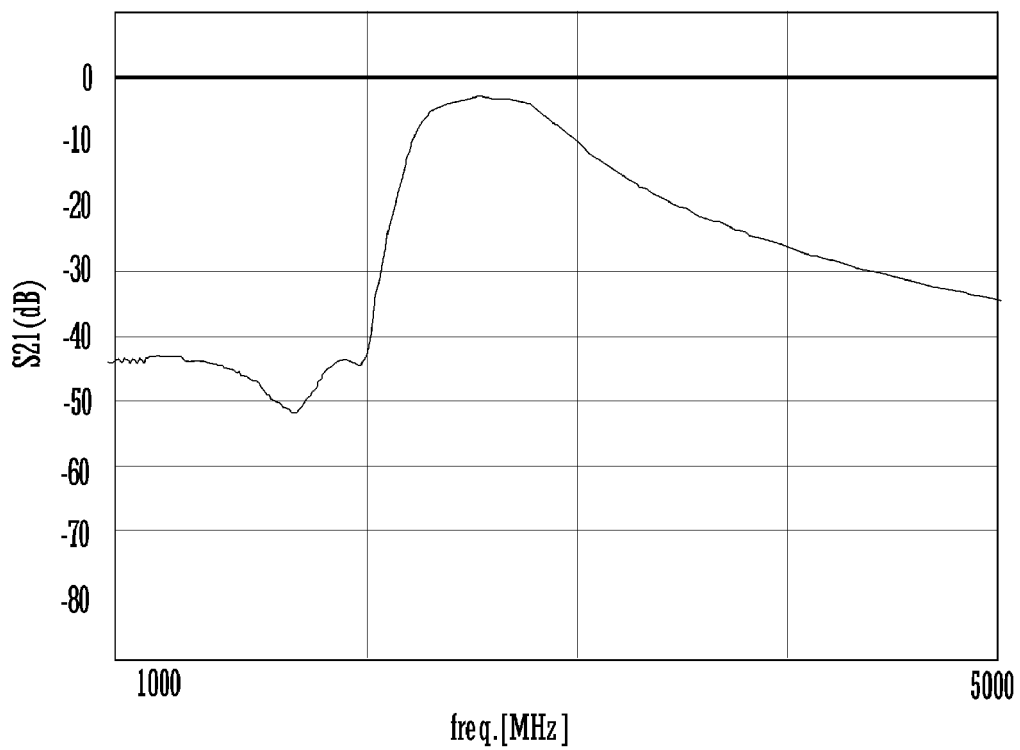
FIG. 6 is a diagram illustrating a band pass characteristic of the laminated band pass filter.

FIG. 6 shows a band pass characteristic (S21 characteristic of an S parameter) of the filter.

In this example, a bandpass characteristic in which a frequency band in a range from approximately 2300 MHz to approximately 2750 MHz corresponds to a pass band and other frequency bands are cut off is obtained. Furthermore, attenuation poles are generated in the vicinity of a frequency of approximately 1650 MHz and a frequency of approximately 1950 MHz.

In the laminated band pass filter 1, the plurality of LC parallel resonators are coupled with one another by inductive couplings which are alternately-reversed, and the resonators in the first and third stages are capacitively coupled in a strong manner so that an attenuation pole in a region higher than the pass band is separated toward a high frequency side and large attenuation amounts in the vicinity of the two attenuation poles are ensured. In this way, a characteristic of steep attenuation from the pass band to the low-frequency side is realized.

Note that the configuration is not limited to that described above, and the input/output electrodes may extend by any configuration. For example, the input/output electrode forming layer may be eliminated and the input/output electrodes may directly extend from the second line electrode forming layer 105, for example, through tap connection. Furthermore, the number of stages of resonators is not limited to that of the above configuration, and any configuration may be used. For example, resonators may be connected with one another in four or five stages. In this case, poles of inductive connections between the resonators may be arbitrarily set.

Moreover, although the line electrodes 116 and 118 are preferably U-shaped in this preferred embodiment, they may be meander-line shaped, for example. As a result, inductance of the inductors L1 and L3 of the LC parallel resonators in the respective stages represented by the equivalent circuit is made large.

Note that although, in the foregoing preferred embodiments, the capacitors of the LC parallel resonators are configured preferably by forming the capacitor electrodes on the capacitor electrode forming layer, chip capacitors may be mounted on the laminated body including the dielectric layers and the electrode layers.

Furthermore, although, in the foregoing preferred embodiments, capacitance is generated preferably using the common ground electrode and the capacitor electrodes, capacitance may be generated by forming another capacitor electrode instead of the ground electrode on another electrode forming layer.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A laminated band pass filter comprising:
   a laminated body including a plurality of dielectric layers and a plurality of electrode layers laminated together;
   a plurality of LC parallel resonators including a ground electrode and capacitor electrodes arranged on the plurality of electrode layers and inductor electrodes connected to the ground electrode and to the capacitor electrodes; wherein
   the inductor electrodes include line electrodes and via electrodes;
   first ends of the line electrodes are connected to the capacitor electrodes by the via electrodes, and the via electrodes are not shared by any of the inductor electrodes and second ends of the line electrodes are connected to the ground electrode by the via electrodes;
   connection points between corresponding ones of the via electrodes and the capacitor electrodes define a starting point of the inductor electrodes and connection points between corresponding ones of the via electrodes and the ground electrode define the ending points of the inductor electrodes;
   each of the inductor electrodes are arranged in a loop shape when viewed from a perpendicular or substantially perpendicular direction relative to a lamination direction of the laminated body;
   the line electrodes of the inductor electrodes of at least two of the plurality of LC parallel resonators are arranged on different electrode layers of the plurality of electrode layers;
   the at least two of the plurality of LC parallel resonators including the inductor electrodes arranged on the different electrode layers are arranged in an arrangement direction that is perpendicular or substantially perpendicular to the lamination direction of the plurality of dielectric layers and the plurality of electrode layers, and the inductor electrodes of the at least two of the plurality of LC parallel resonators are arranged such that the loops overlap with each other when viewed from the arrangement direction.

2. The laminated band pass filter according to claim 1, wherein directions of the loops of the inductor electrodes of the at least two of the plurality of LC parallel resonators are opposite to each other.

3. The laminated band pass filter according to claim 1, wherein at least one of the at least two of the plurality of LC parallel resonators is an input stage LC parallel resonator or an output stage LC parallel resonator.

4. The laminated band pass filter according to claim 3, wherein at least one of an input electrode is connected to the input stage LC parallel resonator of the plurality of LC parallel resonators and an output electrode is connected to the output stage LC parallel resonator of the plurality of LC parallel resonators is connected to one, said at least one of the input and output electrodes of the via electrodes between a corresponding one of the line electrodes and a corresponding one of the capacitor electrodes.

5. The laminated band pass filter according to claim 1, wherein the line electrodes of the at least two of the plurality of LC parallel resonators are arranged so as to overlap with each other in a loop shape when viewed from the lamination direction.

6. The laminated band pass filter according to claim 1, wherein at least one of the line electrodes of the at least two of the plurality of LC parallel resonators has a meander-line shape or a U-shape.

7. The laminated band pass filter according to claim 1, further comprising:
   an additional capacitor electrode arranged to provide skip coupling and including one terminal arranged to face one of the capacitor electrodes of the at least two of the plurality of LC parallel resonators and another terminal arranged to face another one of the capacitor electrodes of the at least two of the plurality of LC parallel resonators.

8. The laminated band pass filter according to claim 1, wherein one of the capacitor electrodes is included in an input stage LC parallel resonator of the plurality of LC parallel resonators and another one of the capacitor electrodes is included in an output stage LC parallel resonator of the plurality of LC parallel resonators and the one and another one of the capacitor electrodes are adjacent to each other in a common electrode layer of the plurality of electrode layers.

* * * * *